(12) United States Patent  (10) Patent No.: US 9,547,744 B2
Kungsakawin et al.  (45) Date of Patent: Jan. 17, 2017

(54) METHOD FOR REUSING AND VERIFYING ELECTRONIC CIRCUITS

(71) Applicant: Celestica Technology Consultancy (Shanghai) Co. Ltd., Shanghai (CN)

(72) Inventors: Sirichai Kungsakawin, Shanghai (CN); Rungrot Siripornpermsak, Shanghai (CN)

(73) Assignee: Celestica Technology Consultancy (Shanghai) Co. Ltd., Shanghai (CN)

( * ) Notice: Subject to any disclaimer, the term of this patent is extended or adjusted under 35 U.S.C. 154(b) by 0 days.

(21) Appl. No.: 14/744,214

(22) Filed: Jun. 19, 2015

(65) Prior Publication Data

US 2016/0371422 A1 Dec. 22, 2016

(51) Int. Cl.
*G06F 17/50* (2006.01)
(52) U.S. Cl.
CPC .................................. *G06F 17/5081* (2013.01)
(58) Field of Classification Search
CPC .............. G06F 17/5045; G06F 17/5054; G06F 17/5072; G06F 17/5081; G06F 17/5068; G06F 17/5022; G06F 17/5036; G06F 17/505; G06F 17/5077
See application file for complete search history.

(56) References Cited

U.S. PATENT DOCUMENTS

2007/0152708 A1* 7/2007 Madurawe ....... H03K 19/17796
326/39
2009/0113166 A1* 4/2009 Houston ............. G06F 11/1068
711/216

FOREIGN PATENT DOCUMENTS

CN 102486806 A * 11/2012 ............. G06F 17/50

* cited by examiner

*Primary Examiner* — Vuthe Siek
(74) *Attorney, Agent, or Firm* — Juan Carlos A. Marquez; Maruqez IP Law Office, PLLC (57) ABSTRACT

The present invention provides a method for reusing and verifying electronic circuits, including the following steps of comparing company part numbers of new circuit design with company part numbers of previous circuit design; determining whether the company part numbers of the new circuit design are identical to the company part numbers of the previous circuit design; reporting the same company part numbers between the new circuit design and the previous circuit if the company part numbers of the new circuit design are identical to the company part numbers of the previous circuit design; determining whether the circuit fingerprints of the new circuit design match the circuit fingerprints of the previous circuit design; and verifying and reporting that the previous circuit design is reused in the new circuit design if the circuit fingerprints of the new circuit design match the circuit fingerprints of the previous circuit design.

17 Claims, 4 Drawing Sheets

METHOD FOR REUSING AND VERIFYING ELECTRONIC CIRCUITS

BACKGROUND OF THE INVENTION

1. Field of the Invention

The present invention relates to an electronic circuit design, and more particularly, to a method for verifying that portions of a previous electronic design are reused in a new electronic design.

2. The Prior Arts

With the rapid development of semiconductor technology and electronic circuit design techniques, a number of different and complex printed circuit boards (PCBs) have been designed in industry. PCBs include the placement of electronic components, such as resistors, capacitors, transistors and the metallic interconnect of these components laminated onto a non-conductive substrate, via conductive traces, pads and other features.

In response to the complex electronic circuit design and the design time requirement, Electronic Design Automation (EDA) software and Electrical Computer Aided Design (ECAD) software are widely used in the design, testing and verification of PCBs.

Each of the components includes a unique reference designator (such as U1, R1, C27, etc.) in the circuit design. Each of the components can be logically represented as a graphic symbol that shows the component, together with its pins. In addition, each pin may have a unique alphanumeric designation as well as a use description. The circuit designer may logically connect the pins of the various components to form electrical nets performing dedicated functions such as sending data bits, comparing two bits of data, a voltage amplifier etc. Each of the electrical nets performing such a function is known as a circuit. A number of circuits are connected together to form an electronic design. The connection between the components of electronic circuits along with their pins can be represented as a text file that may be exported from the EDA software and the ECAD software.

Each component has a manufacturer's part number. Companies that use these components in their PCB designs typically assign their own company part number to each component. The same components provided by different manufacturers often have the same form, fit and function, such that they will have the same company part number. Therefore, the same circuit design may use different manufacturers' parts for the same component number. Also, the company part numbers and pin numbers are included in their EDA software and ECAD software.

When creating a new electronic design, circuit designers typically reuse portions of previous electronic designs as those circuits may function correctly in the relevant applications. Additionally, only a small portion of the previous electronic design is often changed to create the new electronic design.

However, it is necessary to ensure that the new electronic design performs correctly while the reused portion of the previous electronic design is copied exactly to the new electronic design. Manually checking that the reused portion of the previous electronic design has been correctly copied is laborious, and will often miss errors.

For the sake of meeting the requirements of reducing design errors and shortening the development time of a new electronic designs, it is necessary to provide a method of automating the comparison between the previous electronic design and the new electronic design.

SUMMARY OF THE INVENTION

In light of the foregoing drawbacks, an objective of the present invention is to provide a method for reusing and verifying electronic circuits, thereby enabling the previous circuit design to be correctly reused in a new circuit design.

For achieving the foregoing objective, the present invention provides a method for reusing and verifying electronic circuits, including the steps of comparing company part numbers of a new circuit design with company part numbers of a previous circuit design; determining whether the company part numbers of the new circuit design are identical to the company part numbers of the previous circuit design; reporting the same company part numbers between the new circuit design and the previous circuit if the company part numbers of the new circuit design are identical to the company part numbers of the previous circuit design; determining whether the circuit fingerprints of the new circuit design match the circuit fingerprints of the previous circuit design; and verifying and reporting that the previous circuit design is reused in the new circuit design if the circuit fingerprints of the new circuit design match the circuit fingerprints of the previous circuit design, wherein the circuit fingerprints are the connection relationships between components.

Preferably, the circuit fingerprints are the connection relationships between an active component and/or an integrated circuit and a plurality of passive components, ground and/or a power supply. The active component includes an amplifying component such as a transistor. The plurality of passive components include two-terminal components such as resistors, inductors and capacitors.

Preferably, the method of the present invention may further include the step of generating a first library including the company part numbers of the previous circuit design before the step of comparing the company part number of the new circuit design with the company part numbers of the previous circuit design.

Preferably, the method of the present invention may also include the steps of generating a plurality of connection strings corresponding to a plurality of pins of the previous circuit design; and generating a second library including the plurality of connection strings corresponding to the plurality of pins of the new circuit design.

Preferably, the method of the present invention may further include the step of reporting the different company part numbers between the new circuit design and the previous circuit design if the company part numbers of the new electronic circuit do not match the company part numbers of the previous circuit design.

Preferably, the method of the present invention may further include the step of reporting the same pins between the new circuit design and the previous circuit design if the circuit fingerprints of the new circuit design match the circuit fingerprints of the previous circuit design after the step of determining whether the circuit fingerprints of the new circuit design match the circuit fingerprints of the previous circuit design.

Preferably, the method of the present invention may further include the step of reporting the different pins between the new circuit design and the previous circuit design if the circuit fingerprints of the new circuit design do not match the circuit fingerprints of the previous circuit design after the step of determining whether the circuit fingerprints of the new circuit design match the circuit fingerprints of the previous circuit design.

Preferably, the method of the present invention may further include the step of showing where the differences in the connections of the two components in the two circuit designs are if the circuit fingerprints of the new circuit design do not match the circuit fingerprints of the previous circuit design.

Preferably, the plurality of connection strings are generated and represented by means of a series of numbers, symbols, alphabetical letters and combination thereof in accordance with the connection relationships between pins of a component and pins of other components, wherein the symbols may include "_", ":" and "|".

Preferably, the component may be one of an active component, an integrated circuit and a passive component, but not limited to the present invention.

Preferably, the circuit fingerprints of the new circuit design and the circuit fingerprints of the previous circuit design are generated in accordance with the plurality of connection strings and one of hash function algorithms such as a cyclical redundancy (CRC)-enabled method.

Preferably, the circuit fingerprints may include information of the company part numbers of an active component, an integrated circuit and a passive component, pins and the connection relationships thereof.

Preferably, since the passive components have two pins, the entire performance of the electronic circuits is not changed even though the passive components are placed reversely.

Preferably, if the active component or the integrated circuit is connected to a passive component, the value of the passive component is traced by means of the passive component connected to another active component.

Preferably, the circuit fingerprints are represented and composed of a series of numbers and alphabetical letters.

Preferably, the electronic circuits may include a plurality of active components, a plurality of passive components, a plurality of integrated circuits and a plurality of electrical wires, but not limited to the present invention.

Preferably, the plurality of integrated circuits are microcircuits, microchips or chips.

Preferably, according to one exemplary embodiment of the present invention, the method for reusing and verifying electronic circuits may be performed by one of programming languages and one of hash function algorithms.

Preferably, according to one exemplary embodiment of the present invention, the programming languages may be Java, a C family of programming languages and the like, but are not limited to the present invention.

Preferably, according to one exemplary embodiment of the present invention, one of the hash functions may use the MD5 message-digest algorithm function, for example, producing a 128-bit (16-byte) hash value and the like, but not limited to the present invention.

As described above, the method for reusing and verifying electronic circuits may bring about the following technical effects. Previous circuit designs may be reused in a new circuit design by utilizing the fingerprints of connections of electronic components. As such, the development time of a new circuit design may be shortened, and the cost of production may also be reduced.

BRIEF DESCRIPTION OF THE DRAWINGS

The present invention will be apparent to those skilled in the art by reading the following detailed description of a preferred exemplary embodiment thereof, with reference to the attached drawings, in which.

DETAILED DESCRIPTION OF THE PREFERRED EMBODIMENT

The accompanying drawings are included to provide a further understanding of the invention, and are incorporated in and constitute a part of this specification. The drawings illustrate preferred exemplary embodiments of the invention and, together with the description, serve to explain the principles of the invention.

In light of the foregoing drawings, an objective of the present invention is to provide a method for reusing and verifying electronic circuits. The method for reusing and verifying electronic circuits includes the following steps, as shown in FIGS. 1A and 1B.

Figure 1A:
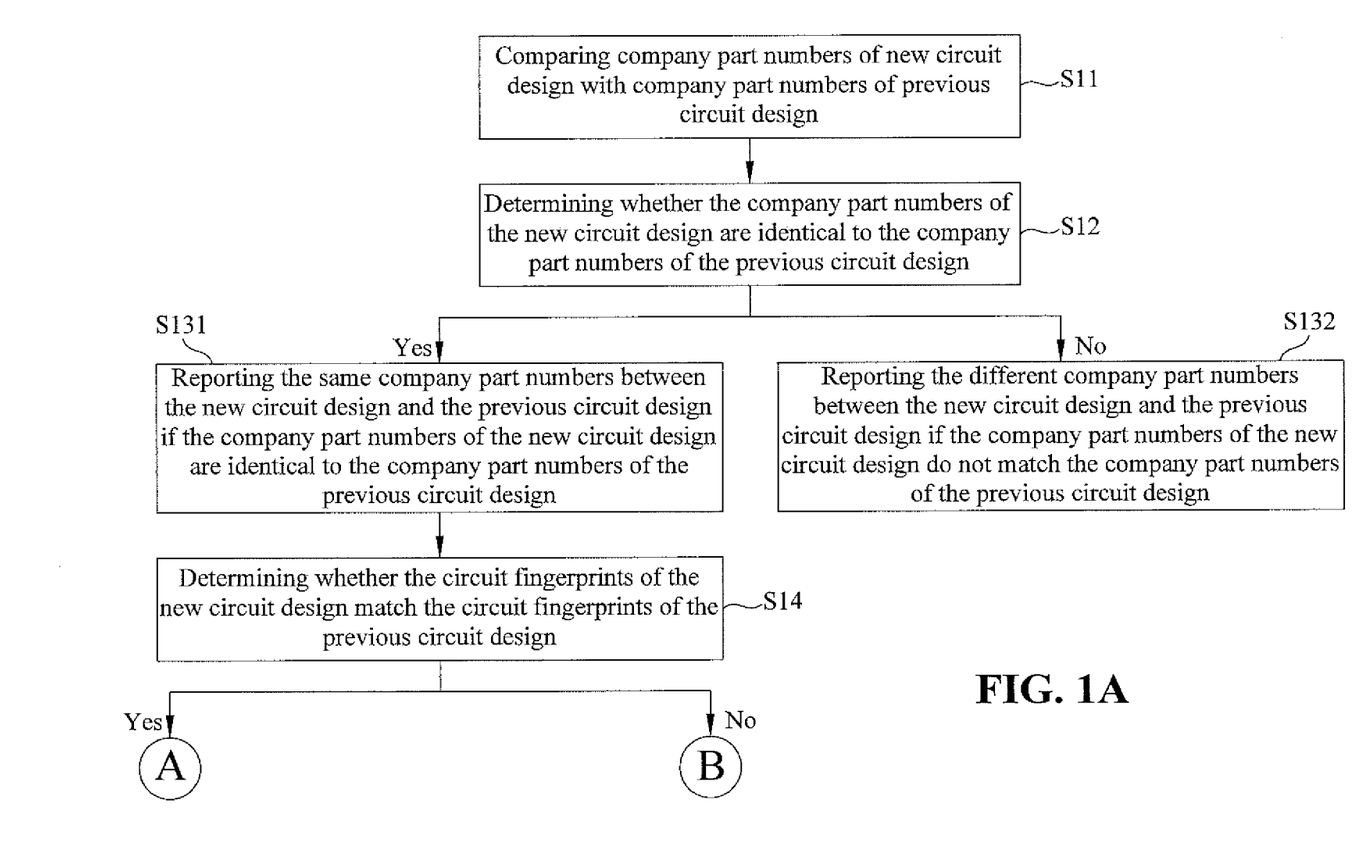
FIGS. 1A and 1B are a flow chart illustrating a method for reusing and verifying electronic circuits by using circuit fingerprints according to the preferred exemplary embodiment of the present invention.
Figure 1B:
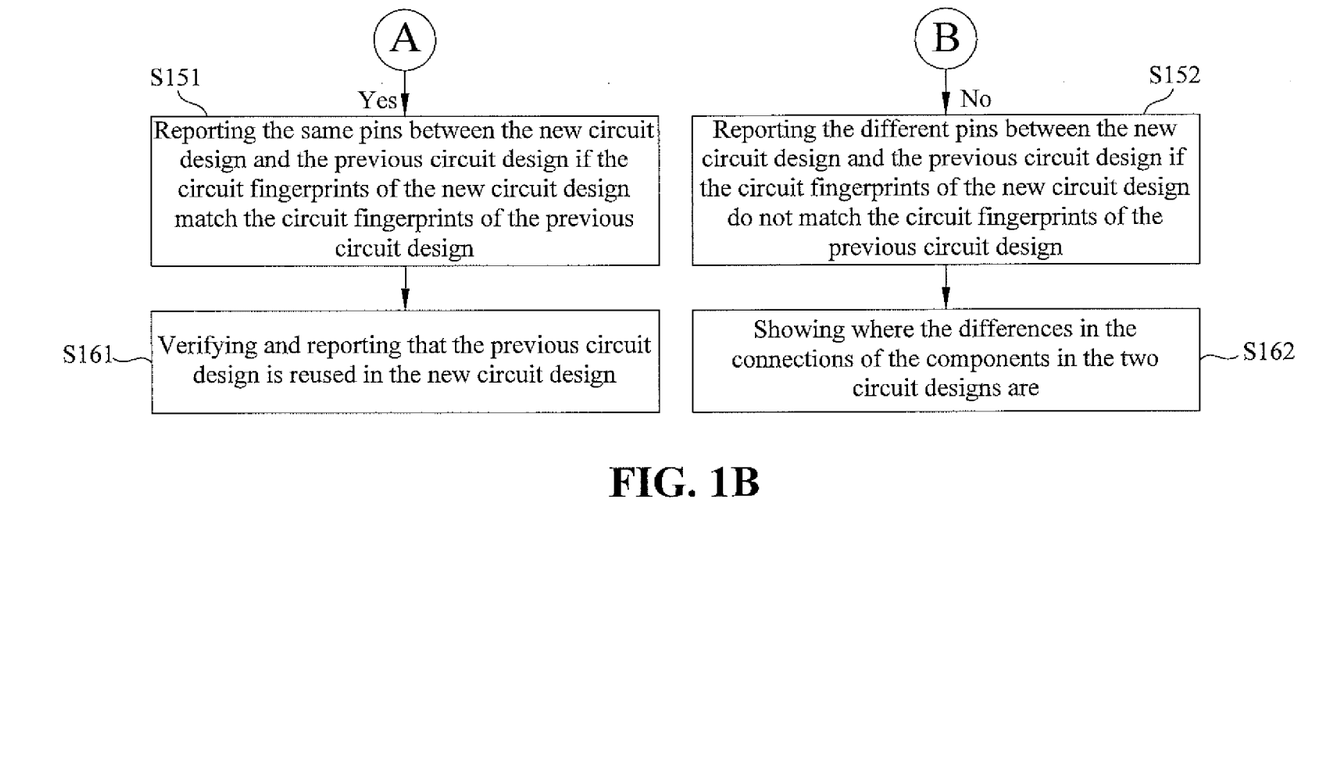

FIGS. 1A and 1B are a flow chart illustrating a method for reusing and verifying electronic circuits by using circuit fingerprints according to the preferred exemplary embodiment of the present invention. As shown in FIG. 1A, the method begins with step S11 of comparing company part numbers of new circuit design with company part numbers of previous circuit design. According to the preferred exemplary embodiment of the present invention, the company part numbers of the previous circuit design and the company part numbers of the new circuit design may have unique reference designators, such as U2, R5, C20, etc.

Subsequently, in step S12, it may be determined whether the company part numbers of the new circuit design are identical to the company part numbers of the previous circuit design. Then, proceed to step S131 and step S132.

In step S131, if the company part numbers of the new circuit design are identical to the company part numbers of the previous circuit design, the same company part numbers between the new circuit design and the previous circuit are reported. Moreover, in step S132, if the company part numbers of the new circuit design do not match the company part numbers of the previous circuit design, the different company part numbers between the new circuit design and the previous circuit design are reported. Then, after step S131, proceed to step S14.

In step S14, it may be determined whether the circuit fingerprints of the new circuit design match the circuit fingerprints of the previous circuit design. The circuit fingerprints are the connection relationships between an active component and/or an integrated circuit and a plurality of passive components, ground and/or a power supply. As such, the circuit fingerprints may include information of the company part numbers of an active component, an integrated circuit and a passive component, pins and the connection relationships thereof, and may be represented by connection strings of connection to other component pins. In brief, the circuit fingerprints may be represented and composed of a series of numbers and alphabetical letters. The plurality of integrated circuits may be microcircuits, microchips or chips. Then, proceed to step S151 and step S152.

According to the preferred exemplary embodiment of the present invention, the method may also include step S151 and step S152. In step S151, if the circuit fingerprints of the new circuit design match the circuit fingerprints of the previous circuit design, the same pin between the new circuit design and the previous circuit design may be reported. Additionally, in step S152, if the circuit fingerprints of the new circuit design do not match the circuit fingerprints of the previous circuit design, the different connections between the new circuit design and the previous circuit design may be reported. Then, proceed to step S161 after step S151, and proceed to step S162 after step S152.

In step S161, if the circuit fingerprints of the new circuit design match the circuit fingerprints of the previous circuit design, it may be verified and reported that the previous circuit design is reused in the new circuit design.

In other words, in accordance with the preferred exemplary embodiment of the present invention, if the circuit fingerprints of the new circuit design match the circuit fingerprints of the previous circuit design, it may be concluded that the previous circuit design has been copied identically in the new circuit design. Moreover, in step S162, if the circuit fingerprints of the new circuit design do not match the circuit fingerprints of the previous circuit design, it may be shown where the differences in the connections of the two components in the two circuit designs are.

Figure 2:
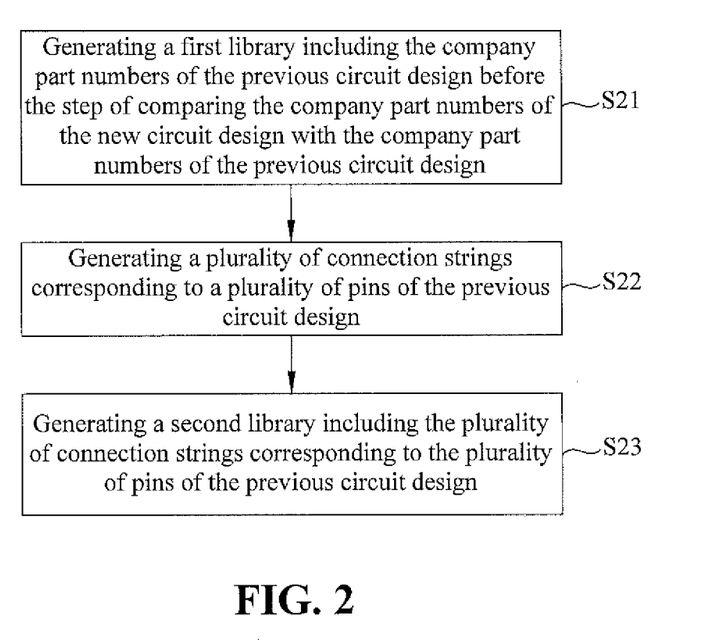
FIG. 2 is a flow chart showing the further steps of the method for reusing and verifying electronic circuits according to the preferred exemplary embodiment of the present invention.

On the other hands, FIG. 2 is a flow chart showing further steps of the method for reusing and verifying circuit design according to the preferred exemplary embodiment of the present invention.

Referring to FIG. 2, according to the preferred exemplary embodiment of the present invention, the method of the present invention may also include step S21 of generating a first library including the company part numbers of the previous circuit design before the step of comparing the company part number of the new circuit design with the company part numbers of the previous circuit design.

In step S22, a plurality of connection strings corresponding to a plurality of pins of the previous circuit design may be generated.

Additionally, in step S23, a second library including the plurality of connection strings corresponding to the plurality of pins of the previous circuit design may be generated.

In one aspect of the present invention, the method may also be applied to larger application specific integrated circuits (ASICs) that has groups of pins performing the defined functions, such as a memory controller, a high-speed bus (i.e., PCIe, etc.). That is to say, the fingerprint may be applied to the group of pins to identify that the connections to the group of pins have been correctly replicated from the previous circuit design to the new circuit design.

According to the preferred exemplary embodiment of the present invention, the plurality of connection strings may be generated in accordance with a connection string rule.

Moreover, the circuit fingerprints of the new circuit design and the circuit fingerprints of the previous circuit design may be generated in accordance with the plurality of string connection numbers and a cyclical redundancy check (CRC)-enabled method.

Additionally, according to the preferred exemplary embodiment of the present invention, the method of the present invention may be performed by one of programming languages and one of hash function algorithms.

The method of the present invention programmed by the programming language is Java or a C family of programming languages, but is not limited herein.

According to the preferred exemplary embodiment of the present invention, the MD5 message-digest algorithm may use a hash function producing a 128-bit (16-byte) hash value. However, the hash function that is used in the present invention is not limited herein.

Figure 3:
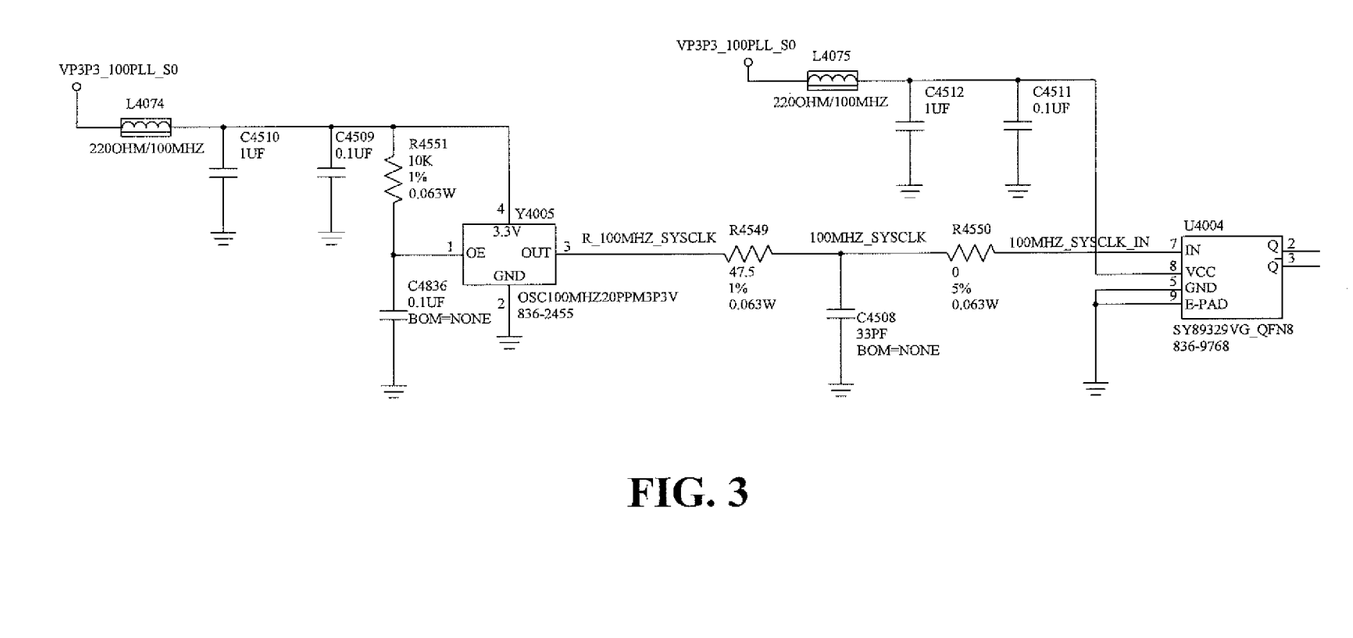
FIG. 3 is a circuit diagram having a plurality of components according to the preferred exemplary embodiment of the present invention.

Moreover, in order to clearly describe in detail how to generate the circuit fingerprints and the connection strings that the active component is connected to the passive components and other components, according to the preferred exemplary embodiment of the present invention, FIG. 3 shows a circuit diagram having a plurality of components. The electronic circuits include a plurality of active components, a plurality of passive components, a plurality of integrated circuits and a plurality of electrical wires.

As shown in FIG. 3, the electronic circuits may include a plurality of components, such as the component numbers C4508, C4509, C4510, C4511, C4512, C4836, L4074, L4075, R4549, R4550, R4551, U4004 and Y4005. The electronic circuit also includes the connection relationships between the plurality of components.

In the preferred exemplary embodiment of the present invention, Table 1 shows an exemplary table of the rule of generating connection strings of active components and passive components in accordance with the preferred exemplary embodiment of the present invention. As such, the connection relationships between the active components and/or the integrated circuits and the passive components in the electronic circuits may be represented according to the connection string rule, as shown in Table 1. Table 2 is a component list showing the component numbers, the resistance/capacitance values, resistance tolerance and notes of the plurality of components. Table 3 shows the connection strings of connecting the pins of a component (Y4005) of FIG. 3 to the pins of other components.

Table 4 shows the connection string and the circuit fingerprint of the component (Y4005) of Table 3 in accordance with the present invention. According to the preferred exemplary embodiment of the present invention, as shown in Table 4, the connection string may be generated and represented by means of a series of numbers, symbols, alphabetical letters and combination thereof. The symbols may include "_", ":" and "|". Moreover, the circuit fingerprint of the component (Y4005) may be represented and composed of a series of numbers and alphabetical letters.

TABLE 1

| Connection relationship between an active component and a passive component | Pin number and value | Connection string |
| --- | --- | --- |
| IC Pin | cp# pin# | 15-14182-01 5 |
| IC Pin connected to power (voltage) | cp# pin#_voltage value | 15-14182-01 3_3.3 |

TABLE 1-continued

| Connection relationship between an active component and a passive component | Pin number and value | Connection string |
|---|---|---|
| IC Pin connected to ground | cp# pin#_0 | 15-14182-01 5_0 |
| IC Pin not connected | cp#_nc | 15-14182-01 5_nc |
| IC pin of do not insert part | DNI_cp# pin# | DNI_15-14182-01 5 |
| IC pin connected to another IC pin | cp# pin#:cp# pin# | 15-14182-01 5:15-14182-01 3 |
| IC pin connected to Resistor or capacitor | cp# pin#:value_tolerance | 15-14182-01 5:4700_low |
| Resistor | value_tolerance value is in Ohms | 4700_low 2000_high |
| Resistor connected to IC pin | value_tolerance:cp# pin# | 1000_low:15-14182-01 5 |
| Resistor connected to power (voltage) | value_tolerance_voltage | 4700_high_3.3 |
| Resistor connected to ground | value_tolerance_0 | 2000_low_0 |
| Resistor left open | value_tolerance_nc | 2000_high_nc |
| Do not insert resistor | DNI_RES | DNI_RES |
| Resistor connected to resistor | value_tolerance:value_tolerance | 4700_low:5000_high |
| Resistor connected to capacitor | value_tolerance:value | 4700_low:0.0000001_5 |
| Capacitor | value value is in Farads | 0.000000022 |
| Capacitor connected to IC pin | value:cp# pin# | 0.0000001:15-14182-01 5 |
| Capacitor connected to power (voltage) | value_voltage | 0.0000001_5 |
| Capacitor connected to ground | value_0 | 0.000000022_0 |
| Capacitor left open | value_nc | 0.000000022_nc |
| Do not insert Capacitor | DNI_CAP | DNI_CAP |
| Capacitor connected to capacitor | value:value | 0.0000001:0.0000001 |
| Capacitor connected to resistor | value:value_tolerance | 0.000000022:4700_low |

TABLE 2

| Component numbers | Resistance/capacitance value | Resistance tolerance | Note |
|---|---|---|---|
| C4508 | 33 pF | | DNI_CAP |
| C4509 | 0.1 uF | | |
| C4510 | 1 uF | | |
| C4511 | 0.1 uF | | |
| C4512 | 1 uF | | |
| C4836 | 0.1 uF | | DNI_CAP |
| L4074 | — | — | |
| L4075 | — | — | |
| R4549 | 47.5 | 1% | |
| R4550 | 0 | 5% | ignore 0 Ω |
| R4551 | 10000.0 | 1% | |
| U4004 | — | — | 836-9768 |
| Y4005 | — | — | 836-2455 |

TABLE 3

| Component numbers | Pin | Connection string of connecting to other component pins |
|---|---|---|
| Y4005 | 1 | 10000.0_low:10000.0_low_3.3:DNI_CAP:DNI_CAP_0 |
| Y4005 | 2 | 836-2455 2_0 |
| Y4005 | 3 | 836-9768 7:47.5_low:DNI_CAP:DNI_CAP_0 |
| Y4005 | 4 | 836-2455 4_3.3 |

TABLE 4

| Component numbers | Circuit fingerprint | Connection string of connecting to other component pins |
|---|---|---|
| Y4005 | bd33cc6a9e9fabceeae1b25cb96b091f | 10000.0_low:10000.0_low_3.3:DNI_CAP:DNI_CAP_0\|836-2455 2_0\|836-9768 7:47.5_low:DNI_CAP:DNI_CAP_0\|836-2455 4_3.3 |

Referring to Table 1, each component may have a company part number, cp#. For active components, each pin has a unique number as cp# pin#, wherein pin# is the alphanumeric for the pin of the component. The passive component class resistors may have their value and tolerance. Tolerance is either high or low with high being <=1% and low being >1%. In other words, low tolerance means that resistors are less accurate, and high tolerance means that resistors are more accurate. Moreover, the passive component class capacitors may have their specific capacitance value. The passive component class inductors are ignored. Since passive components have two pins, the entire performance of the electronic circuits is not changed even though passive components are placed reversely. Therefore, passive components can be dealt with based on the above way. For active components, if active components or integrated circuits are connected to passive components, the values of passive components may be traced by means of passive components connected to other active components. Based on the pin connections between components and a set of rules, a set connection strings may be generated for each pin of a component connected to other component. As shown in Tables 1, 2, 3 and 4, the connection strings for the pins may be separated by semi-colons ":". These connection strings may be further concatenated into a larger connection string for the entire component sequentially starting from the lowest numbered pin and the highest numbered pin (or in a reverse order). As shown in Table 4, the connection strings of these pins may be separated by the "|" character.

Furthermore, the information creating the connection strings of the components may be extracted using EDA and ECAD software. The connection strings may be concatenated with the same software that also performs the CRC. According to the preferred exemplary embodiment of the present invention, the CRC method may be MD5 by the example of JAVA code as follows:

```
try {
    m = MessageDigest.getInstance("MD5");
} catch (NoSuchAlgorithmException e) {
    // TODO Auto-generated catch block
    e.printStackTrace( ):
}
MessageDigest m = null;
    m.update(checkSum.getBytes( ),0,checkSum.length( ));
System.out.println("MD5: " + new BigInteger(1,m.digest( )).toString(16))
```

By performing the CRCs for all active components in a new circuit design, a library of circuit fingerprints for those active components may be created using EDA and ECAD software and database software, such that the circuit fingerprints from the new circuit design may be compared to the circuit fingerprints of the previous circuit designs.

From the above, the method for reusing and verifying electronic circuits by using the unique circuit fingerprints may bring about the following technical effects. The design errors may be reduced, and the development time of a new circuit design may be shortened. Therefore, it is clear that the present invention may effectively overcome the aforementioned prior-art issues, and has industrial applicability.

The above preferred exemplary embodiment describes the principle and effect of the present invention, but is not limited to the present invention. It will be apparent to a person ordinarily skilled in the art that various modifications and variations can be made to the disclosed embodiments. It is intended that the specification and examples be considered as exemplary embodiment only, with a true scope of the disclosure being indicated by the following claims and their equivalents.

Although the present invention has been described with reference to the preferred exemplary embodiments thereof, it is apparent to those skilled in the art that a variety of modifications and changes may be made without departing from the scope of the present invention which is intended to be defined by the appended claims.

What is claimed is:

1. A method for reusing and verifying electronic circuits implemented on a computer system having at least a memory and a display, comprising the steps of:
   comparing company part numbers of a new circuit design with company part numbers of a previous circuit design;
   determining whether the company part numbers of the new circuit design are identical to the company part numbers of the previous circuit design;
   reporting the same company part numbers between the new circuit design and the previous circuit design if the company part numbers of the new circuit design are identical to the company part numbers of the previous circuit design;
   determining whether circuit fingerprints of the new circuit design match circuit fingerprints of the previous circuit design;
   verifying and reporting that the previous circuit design is reused in the new circuit design if the circuit fingerprints of the new circuit design match the circuit fingerprints of the previous circuit design;
   generating a plurality of connection strings corresponding to a plurality of pins of the previous circuit design;
   generating a first library including the plurality of connection strings corresponding to the plurality of pins of the new circuit design;
   storing the first library of the plurality of connection strings in the memory of the computer; and
   outputting at least the circuit fingerprints and the plurality of connection strings of the new circuit design to the display of the computer,
   wherein the circuit fingerprints are the connection relationships between components, and
   wherein the circuit fingerprints are the connection relationships between an active component and/or an integrated circuit and a plurality of passive components, ground and/or a power supply.

2. The method according to claim 1, further comprising the step of:
   generating a second library including the company part numbers of the previous circuit design before the step of comparing the company part numbers of the new circuit design with the company part numbers of the previous circuit design.

3. The method according to claim 1, further comprising the step of:
   reporting the different company part numbers between the new circuit design and the previous circuit design if the company part numbers of the new circuit design do not match the company part numbers of the previous circuit design.

4. The method according to claim 1, further comprising the step of:
   reporting the same pins between the new circuit design and the previous circuit design if the circuit fingerprints of the new circuit design match the circuit fingerprints of the previous circuit design after the step of determining whether the circuit fingerprints of the new circuit design match the circuit fingerprints of the previous circuit design.

5. The method according to claim 1, further comprising the step of:
   reporting the different pins between the new circuit design and the previous circuit design if the circuit fingerprints of the new circuit design do not match the circuit fingerprints of the previous circuit design after the step of determining whether the circuit fingerprints of the new circuit design match the circuit fingerprints of the previous circuit design.

6. The method according to claim 5, further comprising the step of:
   showing where the differences in the connections of the two components in the two circuit designs are if the circuit fingerprints of the new circuit design do not match the circuit fingerprints of the previous circuit design.

7. The method according to claim 1, further comprising the step of:
   showing where the differences in the connections of the two components in the two circuit designs are if the circuit fingerprints of the new circuit design do not match the circuit fingerprints of the previous circuit design.

8. The method according to claim 1, wherein the plurality of connection strings are generated and represented by means of a series of numbers, symbols, alphabetical letters and combination thereof in accordance with the connection relationships between pins of a component and pins of other components, wherein the symbols comprises "_", ":" and "|".

9. The method according to claim 8, wherein the component is one of an active component, an integrated circuit and a passive component.

10. The method according to claim 1, wherein the circuit fingerprints of the new circuit design and the circuit fingerprints of the previous circuit design are generated in accordance with the plurality of connection strings and one of hash function algorithms.

11. The method according to claim 1, wherein the circuit fingerprints comprise information of the company part numbers of an active component, an integrated circuit and a passive component, pins and the connection relationships thereof.

12. The method according to claim 11, wherein since the passive components have two pins, the entire performance of the electronic circuits is not changed even though the passive components are placed reversely.

13. The method according to claim 11, wherein if the active component or the integrated circuit is connected to a passive component, the value of the passive component is traced by means of the passive component connected to another active component.

14. The method according to claim 1, wherein the circuit fingerprints are represented and composed of a series of numbers and alphabetical letters.

15. The method according to claim 1, wherein the method for reusing and verifying electronic circuits is performed by one of programming languages and one of hash function algorithms.

16. The method according to claim 1, wherein the electronic circuits comprise a plurality of active components, a plurality of passive components, a plurality of integrated circuits and a plurality of electrical wires.

17. The method according to claim 16, wherein the plurality of integrated circuits are microcircuits, microchips or chips.

* * * * *